(12) United States Patent
Sakashita

(10) Patent No.: US 6,958,900 B2
(45) Date of Patent: Oct. 25, 2005

(54) MULTI-LAYERED UNIT INCLUDING ELECTRODE AND DIELECTRIC LAYER

(75) Inventor: Yukio Sakashita, Tokyo (JP)

(73) Assignee: TDK Corporation, Tokyo (JP)

( * ) Notice: Subject to any disclaimer, the term of this patent is extended or adjusted under 35 U.S.C. 154(b) by 120 days.

(21) Appl. No.: 10/375,923

(22) Filed: Feb. 26, 2003

(65) Prior Publication Data

US 2004/0166358 A1 Aug. 26, 2004

(51) Int. Cl.⁷ .............................................. H01G 4/228
(52) U.S. Cl. ........................ 361/306.3; 361/306.1; 361/321.1; 361/321.4; 361/311; 361/313
(58) Field of Search ..................... 361/306.3, 321.1, 361/321.4, 320, 311, 313, 328, 329, 330, 306.1; 438/239, 253, 256, 386

(56) References Cited

U.S. PATENT DOCUMENTS

| | | | |
|---|---|---|---|
| 5,206,788 A * | 4/1993 | Larson et al. ............... | 361/313 |
| 5,248,564 A | 9/1993 | Ramesh ....................... | 428/688 |
| 5,426,075 A * | 6/1995 | Perino et al. .................. | 438/3 |
| 5,879,956 A | 3/1999 | Seon et al. ..................... | 438/3 |
| 5,994,276 A | 11/1999 | Hughes et al. .............. | 505/238 |
| 6,096,343 A | 8/2000 | Gergely et al. ............. | 424/499 |
| 6,096,434 A | 8/2000 | Yano et al. ................... | 428/446 |
| 6,194,227 B1 * | 2/2001 | Hase ............................ | 438/3 |
| 6,194,753 B1 | 2/2001 | Seon et al. .................. | 257/295 |
| 6,287,969 B1 | 9/2001 | Hughes et al. .............. | 438/687 |
| 6,303,231 B1 * | 10/2001 | Sawada et al. ............. | 428/470 |
| 6,387,712 B1 | 5/2002 | Yano et al. .................... | 438/3 |
| 2003/0119212 A1 * | 6/2003 | Nishihara et al. ............. | 438/3 |
| 2003/0136998 A1 | 7/2003 | Baniecki et al. ............ | 257/310 |
| 2004/0029399 A1 * | 2/2004 | Honma et al. ............... | 438/778 |

FOREIGN PATENT DOCUMENTS

| | | |
|---|---|---|
| JP | 2001-015382 | 1/2001 |

OTHER PUBLICATIONS

T. Takenaka "Study on the particle orientation of bismuth layer structured ferroelectric ceramics and their application to piezoelectric or pyroelectric materials," *Engineering Doctoral These at the University of Kyoto*, Dec. 1984, pp. 1–170.

* cited by examiner

*Primary Examiner*—Dean A. Reichard
*Assistant Examiner*—Nguyen T. Ha
(74) *Attorney, Agent, or Firm*—Seed IP Law Group PLLC

(57) ABSTRACT

A multi-layered unit according to the present invention includes a support substrate formed of fused quartz, an electrode layer formed on the support substrate and formed of a conductive material, a buffer layer formed on the electrode layer and formed of a dielectric material containing a bismuth layer structured compound having a composition represented by $Bi_4Ti_3O_{12}$ and having an excellent orientation characteristic so that the bismuth layer structured compound is oriented in the c axis direction, and a dielectric layer formed on the buffer layer and formed of a dielectric material containing a bismuth layer structured compound having a composition represented by $SrBi_4Ti_4O_{15}$ and having an excellent orientation characteristic so that the bismuth layer structured compound is oriented in the c axis direction. Since the thus constituted multi-layered unit includes the dielectric layer containing the bismuth layer structured compound oriented in the c axis direction, in the case of, for example, providing an upper electrode on the dielectric layer to form a thin film capacitor and applying a voltage between the electrode layer and the upper electrode, the direction of the electric field substantially coincides with the c axis of the bismuth layer structured compound contained in the dielectric layer. As a result, since the ferroelectric property of the bismuth layer structured compound contained in the dielectric layer can be suppressed and the paraelectric property thereof can be fully exhibited, it is possible to fabricate a thin film capacitor having a small size, large capacitance and an excellent dielectric characteristic.

56 Claims, 2 Drawing Sheets

MULTI-LAYERED UNIT INCLUDING ELECTRODE AND DIELECTRIC LAYER

BACKGROUND OF THE INVENTION

The present invention relates to a multi-layered unit including an electrode and a dielectric layer and, particularly, to a multi-layered unit suitable for fabricating a thin film capacitor having a small size, large capacitance and an excellent dielectric characteristic and suitable for fabricating an inorganic EL (electro-luminescence) device capable of emitting light having high luminescence.

DESCRIPTION OF THE PRIOR ART

Recently, the operating frequency of LSIs (Large Scale Integrated circuits), typically CPUs (Central Processing Units), has become higher and higher. In the LSI having a high operating frequency, power supply noise is very likely to be generated, and once power supply noise occurs, a voltage drop occurs due to parasitic resistance and parasitic inductance of the power supply wiring, causing the LSI to operate erroneously.

In order to prevent such a voltage drop caused by power supply noise, a decoupling capacitor is generally connected between the terminals of the LSI power supply. In the case where a decoupling capacitor is connected between the terminals of the LSI power supply, the impedance of the power supply wiring decreases to effectively prevent voltage drop caused by power supply noise.

The impedance required of the power supply wiring is proportional to the operating voltage of the LSI and inversely proportional to the integration density of the LSI, the switching current of the LSI and the operating frequency of the LSI. Therefore, in current LSIs, which have high integration density, low operating voltage and high operating frequency, the impedance required of the power supply wiring is extremely low.

In order to achieve such low impedance of the power supply wiring, it is necessary to increase the capacitance of the decoupling capacitor and considerably lower the inductance of the wiring connecting the terminals of the LSI power supply and the decoupling capacitor.

As a decoupling capacitor having a large capacitance, an electrolytic capacitor or a multilayer ceramic capacitor is generally employed. However, since the size of an electrolytic capacitor or multilayer ceramic capacitor is relatively large, it is difficult to integrate it with an LSI. Therefore, the electrolytic capacitor or multilayer ceramic capacitor has to be mounted on a circuit substrate independently of the LSI and, as a result, the length of wiring for connecting the terminals of the LSI power supply and the decoupling capacitor is inevitably long. Accordingly, in the case where an electrolytic capacitor or a multilayer ceramic capacitor is employed as a decoupling capacitor, it is difficult to lower the inductance of the wiring for connecting the terminals of the LSI power supply and the decoupling capacitor.

In order to shorten the wiring for connecting the terminals of the LSI power supply and the decoupling capacitor, use of a thin film capacitor having a smaller size than that of an electrolytic capacitor or a multilayer ceramic capacitor is suitable.

Japanese Patent Application Laid Open No. 2001-15382 discloses a thin film capacitor having a small size and large capacitance which employs PZT, PLZT, (Ba, Sr) $TiO_3$ (BST), $Ta_2O_5$ or the like as a dielectric material.

However, the thin film capacitor employing any one of the above mentioned materials is disadvantageous in that the temperature characteristic thereof is poor. For example, since the dielectric constant of BST has a temperature dependency of −1000 to −4000 ppm/° C., in the case where BST is employed as a dielectric material, the capacitance of the thin film capacitor at 80° C. varies between −6% and −24% in comparison with that at 20° C. Therefore, a thin film capacitor employing BST as a dielectric material is not suitable for use as a decoupling capacitor for a high operating frequency LSI whose ambient temperature frequently reaches 80° C. or higher owing to heat generated by electric power consumption.

Furthermore, the dielectric constant of a dielectric thin film formed of any one of the above mentioned materials decreases as the thickness thereof decreases and the capacitance thereof greatly decreases when an electric field of 100 kV/cm, for example, is applied thereto. Therefore, in the case where any one of the above mentioned materials is used as a dielectric material for a thin film capacitor, it is difficult to simultaneously make the thin film capacitor small and the capacitance thereof great.

In addition, Moreover, since the surface roughness of a dielectric thin film formed of any one of the above mentioned materials is high, its insulation performance tends to be lowered when formed thin.

It might be thought possible to overcome these problems by using a bismuth layer structured compound as a dielectric material for a thin film capacitor. The bismuth layer structured compound is discussed by Tadashi Takenaka in "Study on the particle orientation of bismuth layer structured ferroelectric ceramics and their application to piezoelectric or pyroelectric materials" Engineering Doctoral Thesis at the University of Kyoto (1984), Chapter 3, pages 23 to 36.

It is known that the bismuth layer structured compound has an anisotropic crystal structure and behaves as a ferroelectric material but that the bismuth layer structured compound exhibits only weak property as a ferroelectric material and behaves like as a paraelectric material along a certain axis of orientation.

The property of the bismuth layer structured compound as a ferroelectric material is undesirable when the bismuth layer structured compound is utilized as a dielectric material for a thin film capacitor since it causes variation in dielectric constant. Therefore, when a bismuth layer structured compound is used as a dielectric material for a thin film capacitor, it is preferable that its paraelectric property can be fully exhibited.

Therefore, a need has been felt for the development of a thin film capacitor of small size, large capacitance and excellent dielectric characteristic that has a dielectric layer in which a bismuth layer structured compound oriented in the axis of orientation along which the bismuth layer structured compound exhibits only weak property as a ferroelectric material and behaves like a paraelectric material.

On the other hand, it is necessary in order to fabricate an inorganic EL (electro-luminescence) device for emitting light having high luminescence to provide a dielectric layer having a high insulating property between an electrode and an inorganic EL device and it is therefore required to develop an inorganic EL device provided with a dielectric layer in which a bismuth layer structured compound oriented in the axis of orientation along which the bismuth layer structured compound exhibits only weak property as a ferroelectric material and behaves like a paraelectric material.

SUMMARY OF THE INVENTION

It is therefore an object of the present invention to provide a multi-layered unit suitable for fabricating a thin film capacitor having a small size, large capacitance and an excellent dielectric characteristic and suitable for fabricating an inorganic EL (electro-luminescence) device capable of emitting light having high luminescence.

The above and other objects of the present invention can be accomplished by a multi-layered unit constituted by forming on a support substrate formed of a material on which crystals cannot be epitaxially grown, an electrode layer formed of a conductive material, a buffer layer containing a bismuth layer structured compound oriented in the [001] direction, and a dielectric layer formed by epitaxially growing a dielectric material containing a bismuth layer structured compound on the electrode layer and oriented in the [001] direction in this order, a bismuth layer structured compound having an excellent orientation characteristic being selected as the bismuth layer structured compound contained in the buffer layer and a bismuth layer structured compound having an excellent characteristic as a capacitor material being selected as the bismuth layer structured compound contained in the dielectric layer, thereby forming an interface between the buffer layer and the dielectric layer.

In the present invention, the [001] direction as termed herein means the [001] direction of a cubic crystal, a tetragonal crystal, a monoclinic crystal or an orthorhombic crystal.

According to the present invention, since the buffer layer containing a bismuth layer structured compound having an excellent orientation characteristic and oriented in the [001] direction is formed on the electrode layer, the dielectric layer of a dielectric material containing a bismuth layer structured compound oriented in the [001] direction can be desirably formed on the buffer layer by epitaxially growing the dielectric material containing the bismuth layer structured compound having an excellent characteristic as a capacitor material.

Therefore, according to the present invention, since the c axis of the bismuth layer structured compound having an excellent characteristic as a capacitor material and contained in the dielectric layer can be oriented so as to be perpendicular to the electrode layer, in the case of, for example, providing an upper electrode on the dielectric layer and applying a voltage between the electrode layer and the upper electrode, the direction of the electric field substantially coincides with the c axis of the bismuth layer structured compound contained in the dielectric layer. Accordingly, since the ferroelectric property of the bismuth layer structured compound contained in the dielectric layer can be suppressed and the paraelectric property thereof can be fully exhibited, it is possible to incorporate a thin film capacitor having a small size and large capacity into a semiconductor wafer together with other devices.

Further, since the dielectric layer of the dielectric material containing the bismuth layer structured compound whose c axis orientation is improved has a high insulating property, it is possible to form the dielectric layer thinner and therefore make a thin film capacitor much smaller.

Furthermore, since the dielectric layer of the dielectric material containing the bismuth layer structured compound whose c axis orientation is improved has a high insulating property, it is possible to cause an inorganic EL device to emit light in a desired manner and fabricate an inorganic EL device capable of emitting light having high luminescence by disposing the inorganic EL device on the dielectric layer of the multi-layered unit according to the present invention, disposing another electrode on the inorganic EL device and applying a voltage between the electrode layer and another electrode.

In the present invention, the dielectric material containing the bismuth layer structured compound may contain unavoidable impurities.

In a preferred aspect of the present invention, the bismuth layer structured compound contained in the buffer layer and the bismuth layer structured compound contained in the dielectric layer have different compositions from each other, thereby forming an interface between the buffer layer and the dielectric layer.

In another preferred aspect of the present invention, the buffer layer and the dielectric layer are formed using different thin film forming processes, thereby forming an interface between the buffer layer and the dielectric layer. In this case, the bismuth layer structured compound contained in the buffer layer and the bismuth layer structured compound contained in the dielectric layer may have the same composition as each other.

In the present invention, it is sufficient for the support substrate to be formed of a material on which crystals cannot be epitaxially grown and the material for forming the support substrate is not particularly limited. An amorphous substrate made of fused quartz or the like, a polycrystal substrate made of ceramic or the like, a heat-resistant glass substrate, a resin substrate or the like can be used as the support substrate.

In the present invention, the multi-layered unit includes an electrode layer formed of a conductive material on the support substrate.

In the present invention, the material for forming the electrode layer is not particularly limited and can be a metal such as platinum (Pt), ruthenium (Ru), rhodium (Rh), palladium (Pd), iridium (Ir), gold (Au), silver (Ag), copper (Cu), nickel (Ni) or the like, an alloy containing at least one of these metal as a principal component, a conductive oxide such as NdO, NbO, $RhO_2$, $OsO_2$, $IrO_2$, $RuO_2$, $SrMoO_3$, $SrRuO_3$, $CaRuO_3$, $SrVO_3$, $SrCrO_3$, $SrCoO_3$, $LaNiO_3$, Nb doped $SrTiO_3$ or the like or a mixture of these.

In the present invention, the electrode layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like.

In the present invention, the multi-layered unit includes a buffer layer formed on the electrode layer and containing a bismuth layer structured compound oriented in the [001] direction, namely, the c axis direction. The buffer layer serves to ensure that a dielectric material containing a bismuth layer structured compound having an excellent characteristic as a capacitor material can be epitaxially grown thereon to form a dielectric layer of the dielectric material containing the bismuth layer structured compound oriented in the [001] direction, namely, the c axis direction.

Therefore, as the bismuth layer structured compound for forming the buffer layer, a bismuth layer structured compound having an excellent orientation characteristic is selected.

The bismuth layer structured compound has a composition represented by the stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W). In the case where the symbol A and/or B includes two or more elements, the ratio of the elements can be arbitrarily determined.

As shown in FIG. 1, the bismuth layer structured compound has a layered structure formed by alternately laminating perovskite layers 1 each including perovskite lattices 1a made of (m−1) $ABO_3$ and $(Bi_2O_2)^{2+}$ layers 2.

The number of laminates each consisting of the perovskite layer 1 and the $(Bi_2O_2)^{2+}$ layer 2 is not particularly limited and it is sufficient for the bismuth layer structured compound to include at least one pair of $(Bi_2O_2)^{2+}$ layers 2 and one perovskite layer 1 sandwiched therebetween.

The c axis of the bismuth layer structured compound means the direction obtained by connecting the pair of $(Bi_2O_2)^{2+}$ layers 2, namely, the [001] direction. Among the bismuth layer structured compounds represented by the above stoichiometric compositional formula, a bismuth layer structured compound having an excellent orientation characteristic is used for forming the buffer layer and in the case where a bismuth layer structured compound where the symbol m is equal to 4 in the general stoichiometric compositional formula thereof, namely, that represented by the stoichiometric compositional formula: $(Bi_2O_2)^{2+}(A_3B_4O_{13})^{2-}$ or $Bi_2A_3B_4O_{15}$, is used as a bismuth layer structured compound for forming the dielectric layer, a bismuth layer structured compound where the symbol m is equal to 3 in the general stoichiometric compositional formula thereof, namely, that represented by the stoichiometric compositional formula: $(Bi_2O_2)^{2+} (A_2B_3O_{10})^{2-}$ or $Bi_2A_2B_3O_{12}$, is preferably used for forming the buffer layer.

In the present invention, it is not absolutely necessary for the degree F of orientation in the [001] direction, namely, c axis orientation of a bismuth layer structured compound contained in a buffer layer to be 100% but it is sufficient for the degree F of c axis orientation of the bismuth layer structured compound to be equal to or more than 80%. It is more preferable for the degree of c axis orientation of the bismuth layer structured compound to be equal to or more than 90% and it is much more preferable for the degree of c axis orientation of the bismuth layer structured compound to be equal to or more than 95%.

The degree F of the c axis orientation of the bismuth layer structured compound is defined by the following formula (1).

$$F=(P-P_0)/(1-P_0)\times 100 \quad (1)$$

In formula (1), $P_0$ is defined as the X-ray diffraction intensity of polycrystal whose orientation is completely random in the c axis direction, namely, the ratio of the sum $\Sigma I_0 (001)$ of reflection intensities $I_0 (001)$ from the surface of [001] of polycrystal whose orientation is completely random to the sum $\Sigma I_0 (hkl)$ of reflection intensities $I_0 (hkl)$ from the respective crystal surfaces of [hkl] thereof ($\Sigma I_0 (001)/\Sigma I_0 (hkl)$), and P is defined as X-ray diffraction intensity of the bismuth layer structured compound in the c axis direction, namely, the ratio of the sum $\Sigma I(001)$ of reflection intensities I(001) from the surface of [001] of the bismuth layer structured compound to the sum $\Sigma I(hkl)$ of reflection intensities I(hkl) from the respective crystal surfaces of [hkl] thereof ($\Sigma I(001)/\Sigma I(hkl)$). The symbols h, k and l can each assume an arbitrary integer value equal to or larger than 0.

In the above formula (1), since $P_0$ is a known constant, when the sum $\Sigma I(001)$ of reflection intensities I(001) from the surface of [001] of the bismuth layer structured compound and the sum $\Sigma I(hkl)$ of reflection intensities I(hkl) from the respective crystal surfaces of [hkl] are equal to each other, the degree F of the c axis orientation of the bismuth layer structured compound is equal to 100%.

In the present invention, the buffer layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Particularly, in the case where the buffer layer has to be formed at a low temperature, a plasma CVD process, a photo-CVD process, a laser CVD process, a photo-CSD process, a laser CSD process or the like is preferably used for forming the buffer layer.

In the present invention, the multi-layered unit includes a dielectric layer made of a dielectric material containing a bismuth layer structured compound oriented in the [001] direction, namely, the c axis direction, that is formed on the buffer layer by epitaxially growing a dielectric material containing a bismuth layer structured compound thereon.

In the present invention, the dielectric layer is formed by epitaxially growing a dielectric material containing a bismuth layer structured compound on the buffer layer.

Since the dielectric layer is formed by epitaxially growing a dielectric material containing a bismuth layer structured compound formed on the buffer layer, it is possible to reliably orient the bismuth layer structured compound contained in the dielectric layer in the [001] direction, namely, the c axis direction. Therefore, in the case where a thin film capacitor is fabricated using the multi-layered unit according to the present invention, since the bismuth layer structured compound does not function as a ferroelectric material but functions as a paraelectric material, it is possible to fabricate a thin film capacitor having a small size, large capacitance and an excellent dielectric characteristic using the multi-layered unit according to the present invention.

In the present invention, it is not absolutely necessary for the degree F of orientation in the [001] direction, namely, c axis orientation of the bismuth layer structured compound contained in the dielectric layer to be 100% and it is sufficient for the degree F of c axis orientation to be equal to or more than 80%. It is more preferable for the degree of c axis orientation of the bismuth layer structured compound to be equal to or more than 90% and it is much more preferable for the degree of c axis orientation of the bismuth layer structured compound to be equal to or more than 95%.

The degree F of the bismuth layer structured compound is defined by the formula (1).

The dielectric characteristic of a dielectric layer can be markedly improved by orienting the bismuth layer structured compound in the [001] direction, namely, the c axis direction in this manner.

More specifically, in the case where a thin film capacitor is fabricated by forming, for example, an upper electrode on the dielectric layer of the multi-layered unit according to the present invention, even if the thickness of the dielectric layer is equal to or thinner than, for example, 100 nm, a thin film capacitor having a relatively high dielectric constant and low loss (tan δ) can be obtained. Further, a thin film capacitor having an excellent leak characteristic, an improved breakdown voltage, an excellent temperature coefficient of the dielectric constant and an excellent surface smoothness can be obtained.

In the present invention, from among the above mentioned bismuth layer structured compounds, a bismuth layer structured compound having an excellent characteristic as a capacitor material and different from that contained in the buffer layer is selected as the bismuth layer structured compound for forming the dielectric layer.

When a bismuth layer structured compound where the symbol m is equal to 3 in the general stoichiometric compositional formula of a bismuth layer structured compound, namely, that represented by the stoichiometric compositional formula: $(Bi_2O_2)^{2+} (A_2B_3O_{10})^{2-}$ or $Bi_2A_2 B_3O_{12}$, is used for forming the buffer layer, a bismuth layer structured compound where the symbol m is equal to 4 in the general stoichiometric compositional formula of a bismuth layer structured compound, namely, that represented by the stoichiometric compositional formula: $(Bi_2O_2)^{2+} (A_3B_4O_{13})^{2-}$ or $Bi_2A_3 B_4O_{15}$, is preferably used as a bismuth layer structured compound for forming the dielectric layer.

In the present invention, it is particularly preferable that the bismuth layer structured compound contained in the dielectric layer has a composition represented by the stoichiometric compositional formula: $Ca_xSr_{(1-x)}Bi_4Ti_4O_{15}$, where x is equal to or larger than 0 and equal to or smaller than 1. If the bismuth layer structured compound having such a composition is used, a dielectric layer having a relatively large dielectric constant can be obtained and the temperature characteristic thereof can be further improved.

In the present invention, parts of the elements represented by the symbols A or B in the stoichiometric compositional formula of the bismuth layer structured compound contained in the dielectric layer are preferably replaced with at least one element Re (yttrium (Y) or a rare-earth element) selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

The preferable amount of replacement by the element Re depends upon the value of the symbol m. For example, in the case where the symbol m is equal to 3, in the compositional formula: $Bi_2A_{2-x}Re_xO_{12}$, x is preferably equal to or larger than 0.4 and equal to or smaller than 1.8 and more preferably equal to or larger than 1.0 and equal to or smaller than 1.4. If the amount of replacement by the element Re is determined within this range, the Curie temperature (phase transition temperature from ferroelectric to paraelectric) of the dielectric layer can be controlled preferably to be equal to or higher than −100° C. and equal to or lower than 100° C. and more preferably to be equal to or higher than −50° C. and equal to or lower than 50° C. If the Curie point is equal to or higher than −100° C. and equal to or lower than 100° C., the dielectric constant of the dielectric thin film 6 increases. The Curie temperature can be measured by DSC (differential scanning calorimetry) or the like. If the Curie point becomes lower than room temperature (25° C.), tan δ further decreases and, as a result, the loss value Q further increases.

Furthermore, in the case where the symbol m is equal to 4 in the general stoichiometric compositional formula of a bismuth layer structured compound, in the compositional formula: $Bi_2A_{(3-x)}Re_xB_4O_{15}$, x is preferably equal to or larger than 0.01 and equal to or smaller than 2.0 and more preferably equal to or larger than 0.1 and equal to or smaller than 1.0.

Although the dielectric layer of the multi-layered unit according to the present invention has an excellent leak characteristic even if it does not contain the element Re, it is possible to further improve the leak characteristic by replacing part of the elements represented by the symbols A or B with the element Re.

For example, even in the case where no part of the elements represented by the symbols A or B in the stoichiometric compositional formula of the bismuth layer structured compound is replaced with element Re, the leak current measured at the electric filed strength of 50 kV/cm can be controlled preferably to be equal to or lower than $1\times10^{-7}$ A/cm$^2$ and more preferably to be equal to or lower than $5\times10^{-8}$ A/cm$^2$ and the short circuit ratio can be controlled preferably to be equal to or lower than 10% and more preferably to be equal to or lower than 5%. However, in the case where parts of the elements represented by the symbols A or B in the stoichiometric compositional formula of the bismuth layer structured compound are replaced with element Re, the leak current measured under the same condition can be controlled preferably to be equal to or lower than $5\times10^{-8}$ A/cm$^2$ and more preferably to be equal to or lower than $1\times10^{-8}$ A/cm$^2$ and the short circuit ratio can be controlled preferably to be equal to or lower than 5% and more preferably to be equal to or lower than 3%.

In the present invention, the dielectric layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Particularly, in the case where the dielectric layer has to be formed at a low temperature, a plasma CVD process, a photo-CVD process, a laser CVD process, a photo-CSD process, a laser CSD process or the like is preferably used for forming the dielectric layer.

The above and other objects and features of the present invention will become apparent from the following description made with reference to the accompanying drawings.

DESCRIPTION OF THE PREFERRED EMBODIMENTS

Figure 1:
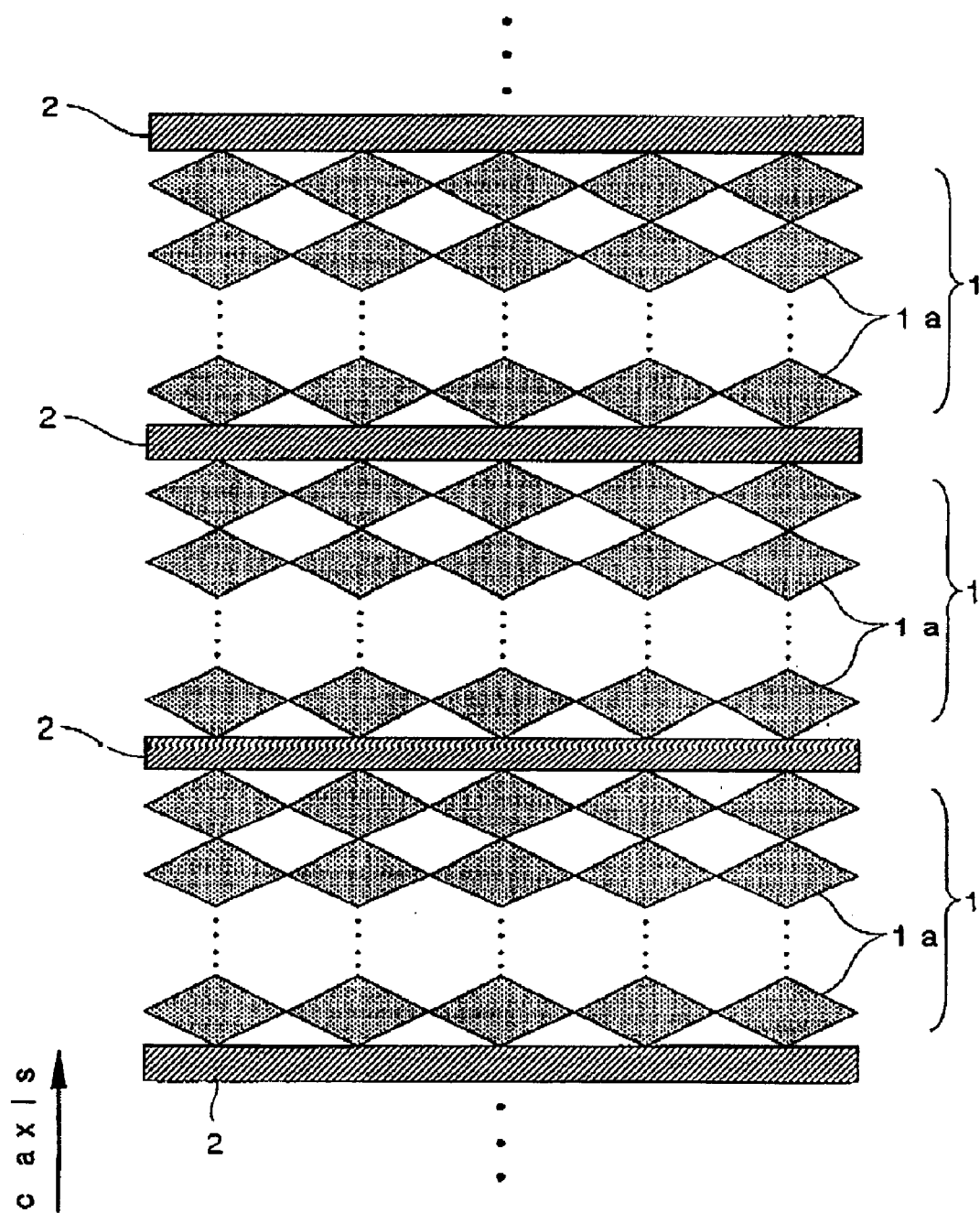
FIG. 1 is a drawing schematically showing the structure of a bismuth layer structured compound.
Figure 2:
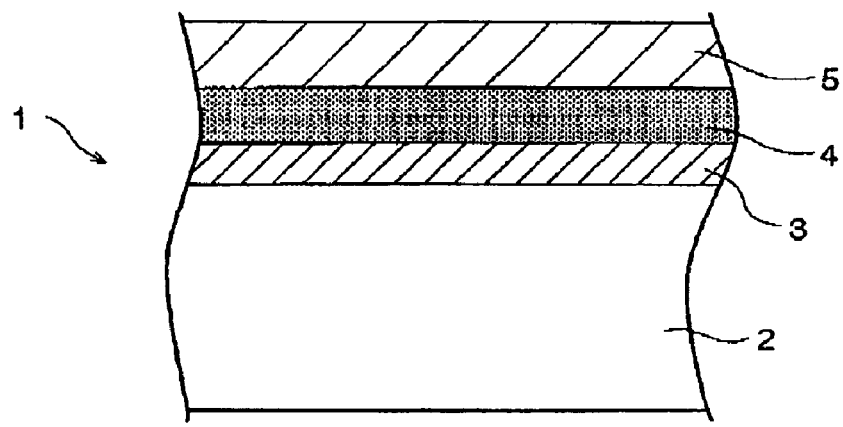
FIG. 2 is a schematic partial cross-sectional view showing a multi-layered unit which is a preferred embodiment of the present invention.

FIG. 2 is a schematic partial cross-sectional view showing a multi-layered unit which is a preferred embodiment of the present invention.

As shown in FIG. 2, a multi-layered unit 1 according to this embodiment is constituted by laminating an electrode layer 3, a buffer layer 4 and a dielectric layer 5 on a support substrate 2 in this order.

In this embodiment, the support substrate 2 of the multi-layered unit 1 is formed of fused quartz.

As shown in FIG. 2, the multi-layered unit 1 according to this embodiment includes an electrode layer 3 formed on the support substrate 2 and in this embodiment, the electrode layer 3 is formed of platinum oriented in the [111] direction.

In the case where an electrode layer 3 of platinum is directly formed on the support substrate 2 formed on a silicon single crystal, silicon melts into the platinum to damage the electrode layer 3 and when the multi-layered unit 1 according to this embodiment is used as a component of a thin film capacitor, the performance of the thin film capacitor may become worse. However, in this embodiment, since the electrode layer 3 is formed on the support substrate 2 made of fused quartz, when the multi-layered unit 1 according to this embodiment is used as a component of a thin film capacitor, it is possible to reliably prevent the performance of the thin film capacitor from being lowered.

An electrode layer 3 of platinum is formed on the support substrate 2 so as to have a thickness of 100 nm, for example, by using argon gas having a pressure of 1 pascal (Pa) as a sputtering gas, setting the temperature of the buffer layer 4 to 400° C. and setting the electric power to 100 W.

Since platinum has a cubic crystal structure, when an electrode layer 3 of platinum is formed on the support substrate 2 of fused quartz, the platinum is oriented in the most stable [111] direction.

As shown in FIG. 2, the multi-layered unit 1 according to this embodiment includes a buffer layer 4 of a dielectric material containing a bismuth layer structured compound on the electrode layer 3.

In this embodiment, a bismuth layer structured compound having an excellent orientation characteristic and having a composition represented by the stoichiometric compositional formula: $Bi_4Ti_3O_{12}$ is selected as a bismuth layer structured compound for forming a buffer layer 4 and the bismuth layer structured compound contained in the buffer layer 4 is oriented in the [001] direction, namely, the c axis direction.

In this embodiment, the buffer layer 4 of the dielectric material containing a bismuth layer structured compound having a composition represented by $Bi_4Ti_3O_{12}$ is formed by a metal organic chemical vapor deposition process (MOCVD), for example.

In the case where a buffer layer 4 of the dielectric material containing a bismuth layer structured compound having a composition represented by $Bi_4Ti_3O_{12}$ is formed by a metal organic chemical vapor deposition process (MOCVD), for example, $Bi(CH_3)_3$ and $Ti(O-i-C_3H_7)_4$ are used as constituent gases and the temperature of the support substrate 2 of platinum (Pt) is maintained at 550° C., thereby forming a buffer layer 4 having a thickness of 50 nm and oriented in the [001] direction, namely, the c axis direction.

In this embodiment, the buffer layer 4 serves to ensure that a dielectric layer 5 of a dielectric material containing a bismuth layer structured compound oriented in the [001] direction, namely, the c axis direction, can be formed by epitaxially growing a dielectric material containing a bismuth layer structured compound thereon.

As shown in FIG. 2, the multi-layered unit 1 according to this embodiment includes a dielectric layer 5 formed on the buffer layer 4.

In this embodiment, the dielectric layer 5 is formed of a dielectric material containing a bismuth layer structured compound having a composition represented by the stoichiometric compositional formula: $SrBi_4Ti_4O_{15}$ and having an excellent characteristic as a capacitor characteristic.

In this embodiment, the dielectric layer 5 is formed on the buffer layer 4 using a metal organic deposition (MOD) process.

Concretely, a toluene solution of 2-ethyl hexanoate Sr, a 2-ethyl hexanoate solution of 2-ethyl hexanoate Bi and a toluene solution of 2-ethyl hexanoate Ti are stoichiometrically mixed so that the mixture contains 1 mole of 2-ethyl hexanoate Sr, 4 moles of 2-ethyl hexanoate Bi and 4 moles of 2-ethyl hexanoate Ti and is diluted with toluene. The resultant constituent solution is coated on the buffer layer 4 using a spin coating method and after drying the resultant dielectric layer 5 is tentatively baked at a temperature under which the dielectric layer 5 cannot be crystallized.

The same constituent solution is coated on the thus tentatively baked dielectric layer 5 using a spin coating method to form a coating layer and the coating layer is dried and tentatively baked. These operations are repeated.

When tentative baking is completed, the dielectric layer 5 is baked and a series of operations including coating, drying, tentative baking, coating, drying, tentative baking and baking are repeated until a dielectric layer 5 having a required thickness, for example, 100 nm is obtained.

During these processes, a dielectric material containing a bismuth layer structured compound is epitaxially grown and a dielectric layer 5 oriented in the [001] direction, namely, the c axis direction is formed.

According to this embodiment, the multi-layered unit 1 has such a structure that the electrode layer 3, the buffer layer 4 and the dielectric layer 5 are laminated on the support substrate 2 of fused quartz and the buffer layer 4 is formed on the electrode layer 3 and formed of a dielectric material containing a bismuth layer structured compound having a composition represented by the stoichiometric compositional formula: $Bi_4Ti_3O_{12}$ and having an excellent orientation characteristic so that the bismuth layer structured compound is oriented in the [001] direction, namely, the c axis direction, and, therefore, the dielectric layer 5 can be formed by epitaxially growing a bismuth layer structured compound having a composition represented by the stoichiometric compositional formula: $SrBi_4Ti_4O_{15}$ and having an excellent characteristic as a capacitor characteristic on the buffer layer 4. Therefore, it is possible to reliably orient the bismuth layer structured compound contained in the dielectric layer 5 in the [001] direction, namely, the c axis direction.

Therefore, according to this embodiment, the multi-layered unit 1 includes the dielectric layer 5 formed of the dielectric material containing the bismuth layer structured compound oriented in the [001] direction, namely, the c axis direction, so that in the case of, for example, providing an upper electrode on the dielectric layer 5 of the multi-layered unit 1 according to this embodiment to fabricate a thin layer capacitor and applying a voltage between the electrode layer 3 and the upper electrode, the direction of the electric field substantially coincides with the c axis of the bismuth layer structured compound contained in the dielectric layer 5. Accordingly, since the ferroelectric property of the bismuth layer structured compound can be suppressed and the paraelectric property thereof can be fully exhibited, it is possible to fabricate a thin film capacitor having a small size and large capacitance.

Further, according to this embodiment, since the multi-layered unit 1 includes the dielectric layer 5 formed of a dielectric material containing a bismuth layer structured compound oriented in the [001] direction, namely, the c axis direction, and the dielectric layer 5 containing the bismuth layer structured compound whose c axis orientation is improved has a high insulating property, the dielectric layer 6 can be made thinner. Therefore, it is possible to make a thin film capacitor much thinner.

Furthermore, according to this embodiment, the buffer layer 4 having a thickness of 10 nm is formed using a metal organic chemical vapor deposition (MOCVD) process so as to enable epitaxial growth of a bismuth layer structured compound having an excellent capacitor characteristic thereon and form a dielectric layer 5 containing the bismuth layer structured compound reliably oriented in the [001] direction, namely, the c axis direction and, on the other hand, the dielectric layer 5 on which no layer is formed using an epitaxial growth process and which has a thickness larger than that of the buffer layer 4 is formed using a metal organic decomposition (MOD) process, which is an inexpensive process. Therefore, it is possible to decrease the cost of fabricating a multi-layered unit 1.

Figure 3:
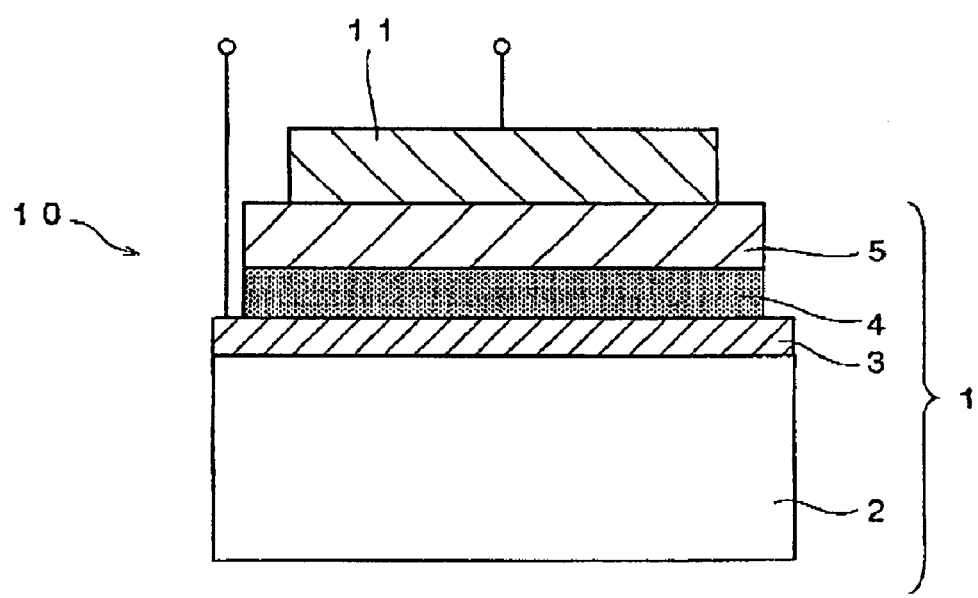
FIG. 3 is a schematic partial cross-sectional view showing a thin film capacitor fabricated using a multi-layered unit which is a preferred embodiment of the present invention.

FIG. 3 is a schematic partial cross-sectional view showing a thin film capacitor fabricated using a multi-layered unit which is a preferred embodiment of the present invention.

As shown in FIG. 3, the thin film capacitor 10 includes the multi-layered unit 1 shown in FIG. 2 and an upper electrode 11 formed on the dielectric layer 5 of the multi-layered unit 1.

In this embodiment, the support substrate 2 of the multi-layered unit 1 serves to ensure the mechanical strength of the entire thin film capacitor 10.

Further, the electrode layer 3 of the multi-layered unit 1 serves as one of electrodes of the thin film capacitor 10.

In this embodiment, the dielectric layer 5 of the multi-layered unit 1 serves as a dielectric layer of the thin film capacitor 10.

In this embodiment, the upper electrode 11 serving as the other of the electrodes of the thin film capacitor 10 is formed on the dielectric layer 5 of the multi-layered unit 1.

The process for forming the upper electrode 11 is not particularly limited and any process usable for forming the electrode layer 3 of the multi-layered unit 1 can be used for forming the upper electrode 11. It is preferable to form the upper electrode 11 using a sputtering process from the viewpoint of the film forming speed.

The material for forming the upper electrode 11 is not particularly limited insofar as it has conductivity and any material usable for forming the electrode layer 3 of the multi-layered unit 1 can be used for forming the upper electrode 11. Further, unlike the electrode layer 3 of the multi-layered unit 1, since it is unnecessary to consider the lattice mismatch with the material for forming the buffer layer 4 and the material for forming the dielectric layer 5, when a material for forming the upper electrode 11 is to be selected and it can be formed at room temperature, the upper electrode 11 can be formed using a base metal such as iron (Fe), cobalt (Co) or the like or an alloy such as WSi, MoSi or the like. The thickness of the upper electrode 11 is not particularly limited insofar as it can serve as the other of the electrodes of the thin film capacitor 10 and the upper electrode 11 can be formed so as to have a thickness of 10 to 10,000 nm, for example.

In the thus constituted thin layer capacitor 10, the bismuth layer structured compound contained in the dielectric layer 5 is oriented so that the c axis thereof is substantially perpendicular to the electrode layer 3 and the upper electrode 11. Therefore, when a voltage is applied between the electrode layer 3 and the upper electrode 11, the direction of the electric field substantially coincides with the c axis of the bismuth layer structured compound contained in the dielectric layer 5. As a result, since the ferroelectric property of the bismuth layer structured compound contained in the dielectric layer 5 can be suppressed and the paraelectric property thereof can be fully exhibited, it is possible to fabricate a thin film capacitor having a small size and large capacitance.

A thin film capacitor 10 having such characteristics can be preferably utilized as a decoupling capacitor, in particular, a decoupling capacitor for an LSI having a high operating frequency.

The present invention has thus been shown and described with reference to specific embodiments. However, it should be noted that the present invention is in no way limited to the details of the described arrangements but changes and modifications may be made without departing from the scope of the appended claims.

For example, in the above described embodiments, the multi-layered unit 1 is constituted by laminating on the support substrate 2, the electrode layer 3, the buffer layer 4 and the dielectric layer 5 in this order. However, the multi-layered unit 1 may be formed by further laminating a plurality of unit multi-layered elements each including an electrode layer 3, buffer layer 4 and a dielectric layer 5 on the dielectric layer 5 and a thin film capacitor may be fabricated by forming an upper electrode on the dielectric layer 5 of the uppermost unit multi-layered element. In the case where the multi-layered unit 1 is constituted by further laminating a plurality of unit multi-layered elements on the dielectric layer 5, if an electrode layer included in each of the unit multi-layered elements is formed by epitaxially growing crystals of a conductive material on a dielectric layer 5, the electrode layer can be oriented in the [001] direction. Therefore, since it is possible to epitaxially grow a dielectric material containing a bismuth layer structured compound and form a dielectric layer 5 of the dielectric material containing the bismuth layer structured compound oriented in the [001] direction, it is unnecessary for each of the unit multi-layered elements to include a buffer layer 4 and each of the unit multi-layered elements can be constituted by an electrode layer and a dielectric layer 5. It is further possible to laminate one or more unit multi-layered elements each including an electrode layer and a dielectric layer 5 and one or more unit multi-layered elements each including an electrode layer, a buffer layer 4 formed on the electrode layer and a dielectric layer 5 formed of a dielectric material containing a bismuth layer structured compound on the buffer layer 4 on the dielectric layer 5 in an arbitrary order and form an upper electrode on the dielectric layer 5 of the uppermost unit multi-layered element, thereby fabricating a thin film capacitor.

Further, in the above described embodiments, although the support substrate 2 is formed of fused quartz, it is not absolutely necessary to employ the support substrate 2 formed of fused quartz. The material for forming the support substrate 2 is not particularly limited insofar as crystal cannot be epitaxially grown thereon. For example, instead of the support substrate 2 formed of fused quartz, another amorphous substrate can be used and further, a polycrystal substrate made of ceramic or the like, a heat-resistant glass substrate, a resin substrate or the like can be used as a support substrate.

Furthermore, in the above described embodiments, although the multi-layered unit 1 includes the electrode layer 3 formed of platinum on the support substrate 2, it is not absolutely necessary to form the electrode layer 3 of platinum and the material for forming the electrode layer 3 is not particularly limited insofar as it has conductivity. The electrode layer 3 may, for example, be formed not of platinum (Pt) but of a metal such as ruthenium (Ru), rhodium (Rh), palladium (Pd), iridium (Ir), gold (Au), silver (Ag), copper (Cu), nickel (Ni) or the like, an alloy containing at least one of these metal as a principal component, a conductive oxide such as NdO, NbO, RhO$_2$, OsO$_2$, IrO$_2$, RuO$_2$, SrMoO$_3$, SrRuO$_3$, CaRuO$_3$, SrVO$_3$, SrCrO$_3$, SrCoO$_3$, LaNiO$_3$, Nb doped SrTiO$_3$ or the like, or a mixture of these.

Moreover, in the above described embodiments, although the electrode layer 3 of the multi-layered unit 1 is formed using a sputtering process, it is not absolutely necessary to form the buffer layer 3 using a sputtering process and the electrode layer 3 may be formed using any of various thin film forming processes such as a vacuum deposition process, a pulsed laser deposition process (PLD), a metal organic chemical vapor deposition process (MOCVD) and a chemical solution deposition process (CSD process) such as a metal-organic decomposition process (MOD) and a sol-gel process or the like instead of a sputtering process.

Further, in the above described embodiments, the multi-layered unit 1 includes the buffer layer 4 formed on the electrode layer 3 and formed of the bismuth layer structured compound having an excellent orientation characteristic and having a composition represented by the stoichiometric compositional formula: Bi$_4$Ti$_3$O$_{12}$ where the symbol m is equal to 3 in the general stoichiometric compositional formula thereof. However, it is not absolutely necessary to form the buffer layer 4 of the bismuth layer structured compound having a composition represented by the stoichiometric compositional formula: Bi$_4$Ti$_3$O$_{12}$ where the symbol m is equal to 3 in the general stoichiometric compositional formula thereof and the buffer layer 4 may be formed of a dielectric material containing a bismuth layer structured compound where the symbol m is not equal to 3 or a dielectric material containing another bismuth layer structured compound whose constituent elements are different from Bi$_4$Ti$_3$O$_{12}$ insofar as it has an excellent orientation characteristic.

Furthermore, in the above described embodiments, although the buffer layer 4 is formed using a metal organic chemical vapor deposition process (MOCVD), it is not absolutely necessary to form the buffer layer 4 using a metal-organic chemical vapor deposition process and the buffer layer 4 may be formed using other thin film forming process such as a vacuum deposition process, a sputtering process, a pulsed laser deposition process (PLD), a chemical solution deposition process (CSD process) such as a metal-organic decomposition process (MOD) and a sol-gel process or the like.

Moreover, in the above described embodiments, the multi-layered unit 1 includes the dielectric layer 5 formed on the buffer layer 4 of a dielectric material containing a bismuth layer structured compound having a composition represented by the stoichiometric compositional formula: SrBi$_4$Ti$_4$O$_{15}$ where the symbol m is equal to 4 in the general stoichiometric compositional formula thereof. However, it is not absolutely necessary to form on the buffer layer 4 a dielectric layer 5 of a dielectric material containing a bismuth layer structured compound having a composition represented by the stoichiometric compositional formula: SrBi$_4$Ti$_4$O$_{15}$ where the symbol m is equal to 4 in the general stoichiometric compositional formula thereof and the dielectric layer 5 may be formed of a dielectric material containing a bismuth layer structured compound where the symbol m is not equal to 4 or a dielectric material containing another bismuth layer structured compound whose constituent elements are different from SrBi$_4$Ti$_4$O$_{15}$ insofar as it has an excellent characteristic as a capacitor material.

Further, in the above described embodiments, although the dielectric layer 5 of the multi-layered unit 1 is formed using a metal-organic decomposition process (MOD), it is not absolutely necessary to form the dielectric layer 5 using a metal-organic decomposition process and the dielectric layer 5 may be formed using some other thin film forming process such as a vacuum deposition process, a sputtering process, a pulsed laser deposition process (PLD), a metal organic chemical vapor deposition process (MOCVD), other chemical solution deposition process (CSD process) such as a sol-gel process or the like.

Furthermore, in the above described embodiments, the multi-layered unit 1 includes the buffer layer 4 formed on the electrode layer 3 and formed of a dielectric material containing a bismuth layer structured compound having a composition represented by Bi$_4$Ti$_3$O$_{12}$ wherein the symbol m is equal to 3 in the general stoichiometric compositional formula thereof and having an excellent orientation characteristic and the dielectric layer 5 formed on the buffer layer 4 of a dielectric material containing a bismuth layer structured compound having a composition represented by SrBi$_4$Ti$_4$O$_{15}$ where the symbol m is equal to 4 in the general stoichiometric compositional formula thereof, and the buffer layer 4 and the dielectric layer 5 are formed of dielectric materials containing bismuth layer structured compounds having different compositions. However, if an interface is formed between the buffer layer 4 and the dielectric layer 5, the buffer layer 4 and the dielectric layer 5 may be formed using different thin film forming processes so as to contain bismuth layer structured compound having the same composition.

Moreover, in the above described embodiments, although the multi-layered unit 1 is used as a component of a thin film capacitor, the multi-layered unit 1 can be used not only as a component of a thin film capacitor but also as a multi-layered unit for causing an inorganic EL (electro-luminescence) device to emit light having high luminescence. Specifically, although an insulating layer having a high insulating property is necessary between an electrode layer 3 and an inorganic EL device in order to cause the inorganic EL device to emit light having high luminescence, since a dielectric layer 5 of a dielectric material containing a bismuth layer structured compound having an improved c axis orientation has a high insulating property, it is possible to cause an inorganic EL device to emit light in a desired manner by disposing the inorganic EL device on the dielectric layer 5, disposing another electrode on the inorganic EL device and applying a voltage between the electrode layer 3 and the other electrode.

According to the present invention, it is possible to provide a multi-layered unit suitable for fabricating a thin film capacitor having a small size, large capacitance and an excellent dielectric characteristic and suitable for fabricating an inorganic EL (electro-luminescence) device capable of emitting light having high luminescence.

What is claimed is:

1. A multi-layered unit constituted by forming on a support substrate formed of a material on which crystals cannot be epitaxially grown, an electrode layer formed of a conductive material, a buffer layer containing a bismuth layer structured compound oriented in the [001] direction, and a dielectric layer formed by epitaxially growing a dielectric material containing a bismuth layer structured compound on the buffer layer and oriented in the [001] direction in this order, a bismuth layer structured compound having an orientation characteristic being selected as the bismuth layer structured compound contained in the buffer layer and a bismuth layer structured compound having characteristics as a capacitor material being selected as the bismuth layer structured compound contained in the dielectric layer, thereby forming an interface between the buffer layer and the dielectric layer.

2. A multi-layered unit in accordance with claim 1, wherein the bismuth layer structured compound contained in the buffer layer and the bismuth layer structured compound contained in the dielectric layer have different compositions.

3. A multi-layered unit in accordance with claim 1, wherein the support substrate is formed of a material selected from a group consisting of an amorphous substrate, a polycrystal substrate and a heat-resistant glass substrate.

4. A multi-layered unit in accordance with claim 2, wherein the support substrate is formed of a material selected from a group consisting of an amorphous substrate, a polycrystal substrate and a heat-resistant glass substrate.

5. A multi-layered unit in accordance with claim 1, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

6. A multi-layered unit in accordance with claim 2, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

7. A multi-layered unit in accordance with claim 3, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

8. A multi-layered unit in accordance with claim 4, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

9. A multi-layered unit in accordance with claim 1, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

10. A multi-layered unit in accordance with claim 2, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

11. A multi-layered unit in accordance with claim 3, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

12. A multi-layered unit in accordance with claim 4, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

13. A multi-layered unit in accordance with claim 5, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

14. A multi-layered unit in accordance with claim 6, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

15. A multi-layered unit in accordance with claim 7, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

16. A multi-layered unit in accordance with claim 8, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

17. A multi-layered unit in accordance with claim 1, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

18. A multi-layered unit in accordance with claim 2, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

19. A multi-layered unit in accordance with claim 3, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

20. A multi-layered unit in accordance with claim 4, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

21. A multi-layered unit in accordance with claim 5, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

22. A multi-layered unit in accordance with claim 6, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

23. A multi-layered unit in accordance with claim 7, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

24. A multi-layered unit in accordance with claim 8, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

25. A multi-layered unit in accordance with claim 9, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

26. A multi-layered unit in accordance with claim 10, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

27. A multi-layered unit in accordance with claim 11, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

28. A multi-layered unit in accordance with claim 12, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

29. A multi-layered unit in accordance with claim 13, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

30. A multi-layered unit in accordance with claim 14, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

31. A multi-layered unit in accordance with claim 15, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

32. A multi-layered unit in accordance with claim 16, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

33. A multi-layered unit in accordance with claim 17, wherein the buffer layer contains the bismuth layer structured compound wherein the symbol m is equal to 3 and the dielectric layer contains the bismuth layer structured compound wherein the symbol m is equal to 4.

34. A multi-layered unit in accordance with claim 18, wherein the buffer layer contains the bismuth layer structured compound wherein the symbol m is equal to 3 and the dielectric layer contains the bismuth layer structured compound wherein the symbol m is equal to 4.

35. A multi-layered unit in accordance with claim 19, wherein the buffer layer contains the bismuth layer structured compound wherein the symbol m is equal to 3 and the dielectric layer contains the bismuth layer structured compound wherein the symbol m is equal to 4.

36. A multi-layered unit in accordance with claim 20, wherein the buffer layer contains the bismuth layer structured compound wherein the symbol m is equal to 3 and the dielectric layer contains the bismuth layer structured compound wherein the symbol m is equal to 4.

37. A multi-layered unit in accordance with claim 21, wherein the buffer layer contains the bismuth layer structured compound wherein the symbol m is equal to 3 and the dielectric layer contains the bismuth layer structured compound wherein the symbol m is equal to 4.

38. A multi-layered unit in accordance with claim 22, wherein the buffer layer contains the bismuth layer structured compound wherein the symbol m is equal to 3 and the dielectric layer contains the bismuth layer structured compound wherein the symbol m is equal to 4.

39. A multi-layered unit in accordance with claim 23, wherein the buffer layer contains the bismuth layer structured compound wherein the symbol m is equal to 3 and the dielectric layer contains the bismuth layer structured compound wherein the symbol m is equal to 4.

40. A multi-layered unit in accordance with claim 24, wherein the buffer layer contains the bismuth layer structured compound wherein the symbol m is equal to 3 and the dielectric layer contains the bismuth layer structured compound wherein the symbol m is equal to 4.

41. A multi-layered unit in accordance with claim 25, wherein the buffer layer contains the bismuth layer structured compound wherein the symbol m is equal to 3 and the dielectric layer contains the bismuth layer structured compound wherein the symbol m is equal to 4.

42. A multi-layered unit in accordance with claim 26, wherein the buffer layer contains the bismuth layer structured compound wherein the symbol m is equal to 3 and the dielectric layer contains the bismuth layer structured compound wherein the symbol m is equal to 4.

43. A multi-layered unit in accordance with claim 27, wherein the buffer layer contains the bismuth layer structured compound wherein the symbol m is equal to 3 and the dielectric layer contains the bismuth layer structured compound wherein the symbol m is equal to 4.

44. A multi-layered unit in accordance with claim 28, wherein the buffer layer contains the bismuth layer structured compound wherein the symbol m is equal to 3 and the dielectric layer contains the bismuth layer structured compound wherein the symbol m is equal to 4.

45. A multi-layered unit in accordance with claim 29, wherein the buffer layer contains the bismuth layer structured compound wherein the symbol m is equal to 3 and the dielectric layer contains the bismuth layer structured compound wherein the symbol m is equal to 4.

46. A multi-layered unit in accordance with claim 30, wherein the buffer layer contains the bismuth layer structured compound wherein the symbol m is equal to 3 and the dielectric layer contains the bismuth layer structured compound wherein the symbol m is equal to 4.

47. A multi-layered unit in accordance with claim 31, wherein the buffer layer contains the bismuth layer structured compound wherein the symbol m is equal to 3 and the dielectric layer contains the bismuth layer structured compound wherein the symbol m is equal to 4.

48. A multi-layered unit in accordance with claim 32, wherein the buffer layer contains the bismuth layer structured compound wherein the symbol m is equal to 3 and the dielectric layer contains the bismuth layer structured compound wherein the symbol m is equal to 4.

49. A multi-layered unit comprising:
a support substrate composed of a material on which crystals cannot be epitaxially grown;
an electrode layer composed of a conductive material overlaying the support substrate;
a buffer layer overlaying the electrode layer, said buffer layer containing a first bismuth layer structured compound oriented in the [001] direction; and
a dielectric layer formed by epitaxially growing a dielectric material containing a second bismuth layer structured compound on the buffer layer and oriented in the [001] direction, the first bismuth layer structured compound contained in the buffer layer being selected to have an orientation characteristic, the second bismuth layer structured compound contained in the dielectric layer being selected to have capacitor characteristics, and the first and second bismuth layer structured compounds forming an interface between the buffer layer and the dielectric layer.

50. A multi-layered unit in accordance with claim 49, wherein the first bismuth layer structured compound and the second bismuth layer structured compound have different compositions.

51. A multi-layered unit in accordance with claim 49, wherein the support substrate is composed of a material selected from a group consisting of an amorphous substrate, a polycrystal substrate and a heat-resistant glass substrate.

52. A multi-layered unit in accordance with claim 49, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

53. A multi-layered unit in accordance with claim 49, wherein the first bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Ca), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

54. A multi-layered unit in accordance with claim 49, wherein the second bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

55. A multi-layered unit in accordance with claim 54, wherein the first bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

56. A multi-layered unit in accordance with claim 55, wherein the symbol m is equal to 3 in the bismuth layer structured compound and the symbol m is equal to 4 in the second bismuth layer structured compound.

* * * * *

UNITED STATES PATENT AND TRADEMARK OFFICE
CERTIFICATE OF CORRECTION

PATENT NO. : 6,958,900 B2
DATED : October 25, 2005
INVENTOR(S) : Yukio Sakashita It is certified that error appears in the above-identified patent and that said Letters Patent is hereby corrected as shown below:

Column 22,
Line 45, "cobalt (Ca)" should read -- cobalt (Co) --.

Signed and Sealed this

Tenth Day of January, 2006

JON W. DUDAS
*Director of the United States Patent and Trademark Office*